(12) United States Patent
Simsek-Ege et al.

(10) Patent No.: US 9,209,199 B2
(45) Date of Patent: Dec. 8, 2015

(54) STACKED THIN CHANNELS FOR BOOST AND LEAKAGE IMPROVEMENT

(71) Applicant: Intel Corporation, Santa Clara, CA (US)

(72) Inventors: Fatma Arzum Simsek-Ege, Boise, ID (US); Jie Jason Sun, Boise, ID (US); Benben Li, Boise, ID (US); Srikant Jayanti, Boise, ID (US); Han Zhao, Santa Clara, CA (US); Guangyu Huang, Boise, ID (US); Haitao Liu, Meridian, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/222,070

(22) Filed: Mar. 21, 2014

(65) Prior Publication Data

US 2015/0270280 A1 Sep. 24, 2015

(51) Int. Cl.
*H01L 27/115* (2006.01)
*H01L 29/792* (2006.01)
*H01L 29/66* (2006.01)
*H01L 29/16* (2006.01)
*H01L 29/04* (2006.01)
*H01L 29/10* (2006.01)
*H01L 21/02* (2006.01)

(52) U.S. Cl.
CPC .... *H01L 27/11582* (2013.01); *H01L 21/02532* (2013.01); *H01L 21/02595* (2013.01); *H01L 27/11556* (2013.01); *H01L 29/04* (2013.01); *H01L 29/1037* (2013.01); *H01L 29/16* (2013.01)

(58) Field of Classification Search
CPC ............. H01L 29/7926; H01L 29/66833; H01L 27/11556; H01L 27/11582
USPC .................................................. 257/314–326
See application file for complete search history.

(56) References Cited

U.S. PATENT DOCUMENTS

| 8,969,948 B2 * | 3/2015 | Simsek-Ege et al. .......... 257/326 |
| 2011/0059595 A1 | 3/2011 | Jung |
| 2012/0003800 A1 * | 1/2012 | Lee et al. ...................... 438/261 |
| 2012/0068259 A1 | 3/2012 | Park et al. |
| 2012/0104484 A1 * | 5/2012 | Lee et al. ...................... 257/324 |
| 2012/0140562 A1 | 6/2012 | Choe et al. |
| 2013/0028027 A1 | 1/2013 | Kim et al. |

OTHER PUBLICATIONS

International Search Report and Written Opinion received for PCT Application No. PCT/US2015/018296, issued on May 29, 2015, 9 pages.

* cited by examiner

*Primary Examiner* — Cuong Q Nguyen
(74) *Attorney, Agent, or Firm* — Alpine Technology Law Group LLC (57) ABSTRACT

A hollow-channel memory device comprises a source layer, a first hollow-channel pillar structure formed on the source layer, and a second hollow-channel pillar structure formed on the first hollow-channel pillar structure. The first hollow-channel pillar structure comprises a first thin channel and the second hollow-channel pillar structure comprises a second thin channel that is in contact with the first thin channel. In one exemplary embodiment, the first thin channel comprises a first level of doping; and the second thin channel comprises a second level of doping that is different from the first level of doping. In another exemplary embodiment, the first and second levels of doping are the same.

16 Claims, 11 Drawing Sheets

STACKED THIN CHANNELS FOR BOOST AND LEAKAGE IMPROVEMENT

TECHNICAL FIELD

Embodiments described herein relate to semiconductor fabrication. More particularly, embodiments of the subject matter disclosed herein relates to fabricating vertical NAND string devices.

BACKGROUND

A vertical NAND string device comprises a thin channel that has been formed along a pillar. Various devices, such as a select gate source (SGS), one or more non-volatile memory cells (NAND memory cells), one or more control gates and a select gate drain (SGD) are arranged along the thin channel. The channel is connected at one end to a bit line (BL) and at the other end to a source. A first select signal is applied to the SGD to control conduction through the channel at the BL end of the channel, and a second signal is applied to the SGS to control conduction through the channel at the source end of the channel. The vertical NAND string device can be arranged into a memory array in which the NAND memory cells are located at intersections of column signal lines (e.g., bit lines) and row signal lines (e.g., word lines). Individual column and/or row signal lines are electrically connected to a memory controller to selectively access and operate the NAND memory cells.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments described herein relate to semiconductor fabrication and, more particularly, to fabricating vertical NAND string devices One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The subject matter disclosed herein provides a Doped Hollow Channel (DHC) vertical NAND string device comprising two three-dimensional (3D) thin channel regions formed on top of each other within the same pillar structure and in which the doping for each thin channel region can be separately optimized independent of the doping of the other region. In particular, the doping of the lower thin channel can be optimized for thin channel continuity and high string current, whereas the doping of the upper thin channel can be optimized to improve leakage current and provided improved voltage boost (program disturb) performance.

Exemplary embodiments of the subject matter disclosed herein provide a memory device comprising a hollow-channel pillar structure. The hollow-channel pillar structure comprises a first end and a second end with the first end of the pillar structure being coupled to a source and the second end of the channel being coupled to a bit line. The pillar structure further comprises a thin channel surrounding a dielectric material in which the thin channel comprising a first region and a second region. The first region is located along the pillar structure in proximity to the source and the second region is located along the pillar structure distal from the source. In one exemplary embodiment, the first region of the thin channel comprises a first level of doping and the second region of the thin channel comprising a second level of doping in which the second level of doping is different from the first level of doping.

Other exemplary embodiments of the subject matter disclosed herein provide a memory device comprising a source layer, a first hollow-channel pillar structure formed on the source layer, and a second hollow-channel pillar structure formed on the first hollow-channel pillar structure. The first hollow-channel pillar structure comprises a first thin channel having a first level of doping; and the second hollow-channel pillar structure comprises a second thin channel having a second level of doping. The second thin channel is in contact with the first thin channel, and the second level of doping is different from the first level of doping. In another exemplary embodiment, the first and second levels of doping are the same.

Figure 1:
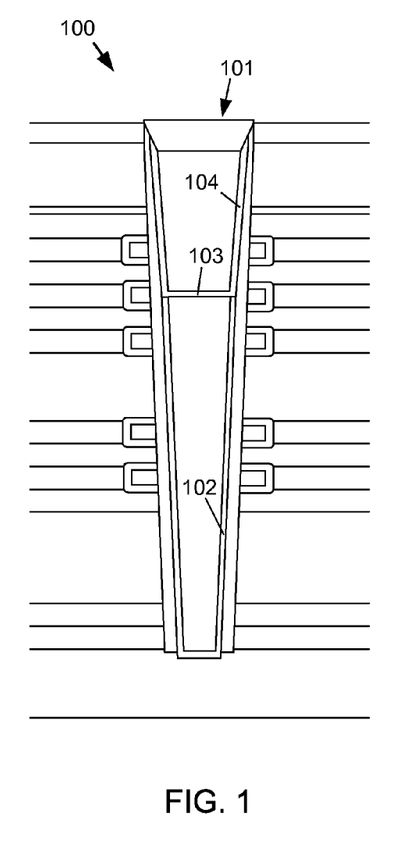
FIG. 1 depicts a side cross-sectional view of a Doped Hollow Channel (DHC) vertical NAND string device according to the subject matter disclosed herein.
Figure 5:
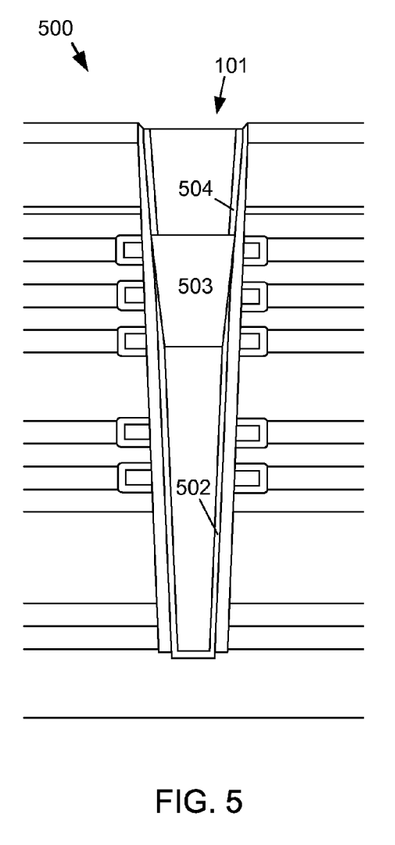
FIG. 5 depicts a side cross-sectional view of a conventional DHC vertical NAND string device.

FIG. 1 depicts a side cross-sectional view of a Doped Hollow Channel (DHC) vertical NAND string device 100 according to the subject matter disclosed herein. DHC NAND vertical string device 100 comprises a channel or pillar structure 101. Pillar structure 101 comprises a thin channel 102, a bridge 103 and a thin channel 104. Thin channel 104 is formed on top of thin channel 102 within the same pillar structure 101. According to the subject matter disclosed herein, the doping for each respective thin channel 102 and 104 can be separately optimized independent of the doping of the other thin channel. FIG. 5, in contrast to FIG. 1, depicts a side cross-sectional view of a conventional DHC vertical NAND string device 500. DHC vertical NAND string device 500 comprises a channel or pillar structure 501. Pillar structure 501 comprises a thin channel 502, a doped polysilicon plug 503 and a solid SGD channel 504. Other components and features forming DHC NAND string device 100 and DHC NAND string device 500 are not indicated in FIGS. 1 and 5 for clarity.

In one exemplary embodiment, the level of doping of thin channel 102 (herein referred to as pillar-doped thin channel 102) comprises a higher level of doping than the level of doping of thin channel 104 (herein referred to as Select-Gate-Drain-doped (SGD-doped) thin channel 104). The relatively higher level of doping in pillar-doped thin channel 102 provides improved channel continuity and contributes to maintaining a high string current. The relatively lower level of doping in SGD-doped thin channel 104 reduces leakage current that causes voltage boost (VBoost) degradation (i.e., an improved program disturb performance).

Bridge 103 does not interfere with current flow because embodiments of the subject matter disclosed herein remove a native oxide interface from between the stacked thin channels. One exemplary embodiment provides that the interface between the pillar-doped thin channel 102 and the SGD-doped thin channel 104 is above bridge 103 in the overall pillar structure 101. In an alternative exemplary embodiment, the interface between the pillar-doped thin channel 102 and the SGD-doped thin channel 104 is at the same level as bridge 103 in the overall pillar structure 101.

Figure 2:
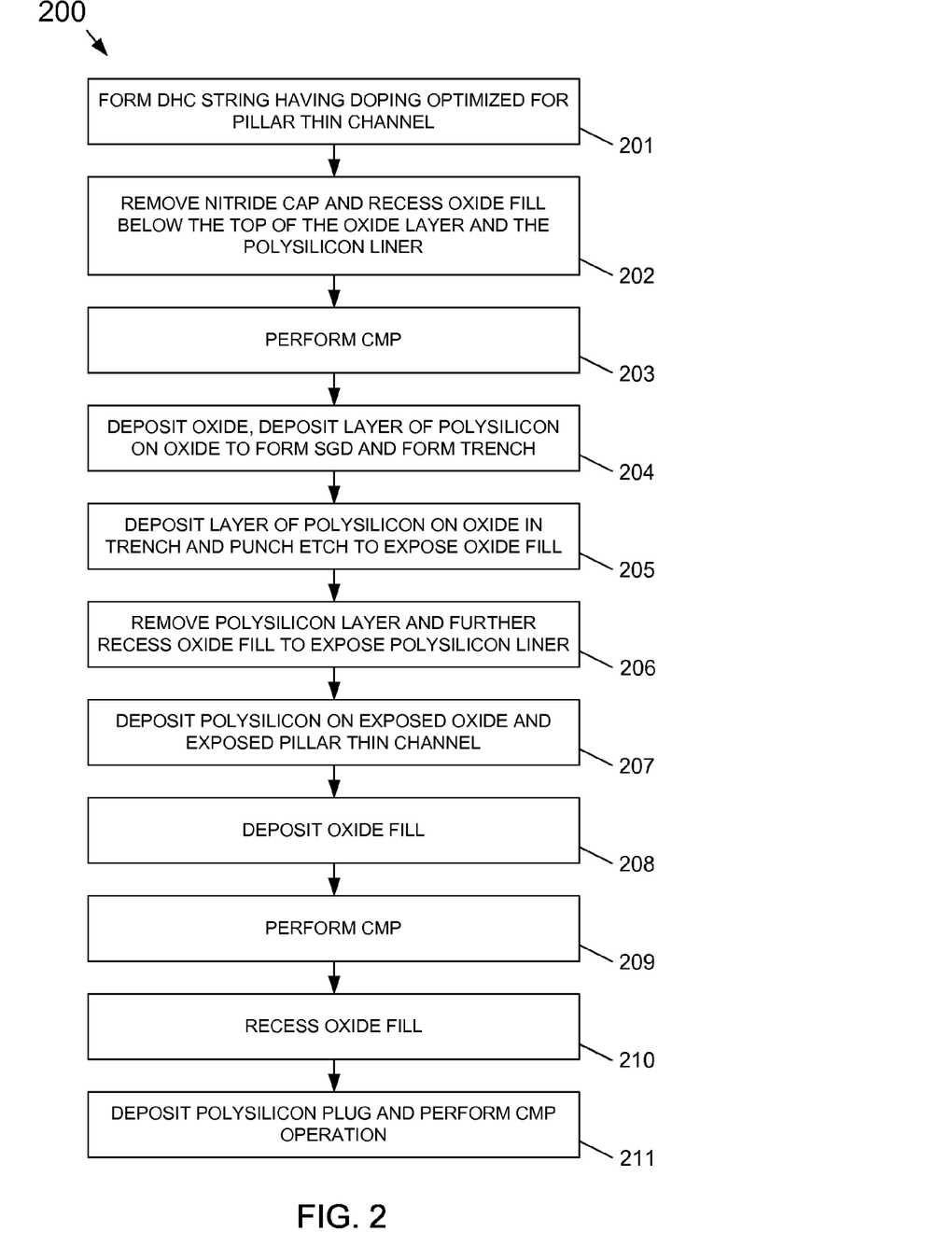
FIG. 2 depicts a flow diagram for an exemplary embodiment of a technique for forming a DHC vertical NAND string device according to the subject matter disclosed herein.

FIG. 2 depicts a flow diagram 200 for an exemplary embodiment of a technique for forming a DHC vertical NAND string device according to the subject matter disclosed herein. At 201, a DHC vertical NAND string is formed using known techniques. FIGS. 3A-3K depict a DHC vertical NAND string device 300 at various stages of fabrication according to the subject matter disclosed herein.

Figure 3A:
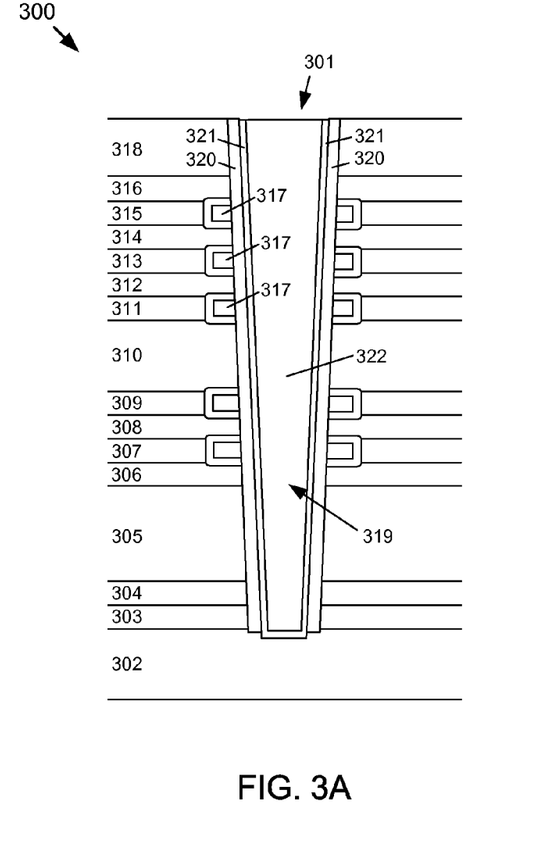
FIGS. 3A-3K depict a DHC vertical NAND string device at various stages of fabrication according to the subject matter disclosed herein.

FIG. 3A depicts a DHC vertical NAND string device 300 according to the subject matter disclosed herein during fabrication such as after performing operation 201 in FIG. 2. In particular, DHC vertical NAND string device 300 has been formed in a well-known manner on a substrate (not shown) to comprise a channel or pillar structure 301. Pillar structure 301 comprises a source 302, a first oxide layer 303, a second oxide layer 304, an SGS layer 305, a third oxide layer 306, a first word line (WL) 307, a fourth oxide layer 307, a second WL layer 309, an oxide separation region 310 between dummy cells (above region 310) and data cells (below region 310), a third WL layer 311, a fifth oxide layer 312, a fourth WL layer 313, a sixth oxide layer 314, a sixth WL layer 315, and a seventh oxide layer 316.

A plurality of dummy and data flash cells 317 have been formed, of which only a few have been indicated. Flash cells 317 are non-volatile memory cells that have been formed along the length of channel 301. In one exemplary embodiment, each individual NAND cell 317 comprises a control gate (not shown), a blocking dielectric (also referred to as an interpoly dielectric) (not shown), a charge storage node (which can be a floating gate (FG) or a localized charge storage layer, such as silicon nitride in the case of Charge Trap Flash (CTF) device) (also referred to as a storage node) (not shown), a tunneling dielectric (not shown), and a channel (not shown). The control gate of each NAND cell 317 is coupled to a corresponding word line (WL) (not shown). In some embodiments of vertical NAND string 300, some of NAND cells 317 toward the SGD end of channel 301 are "dummy" NAND cells that may or may not store data, and some NAND cells 317 toward the SGS end of channel 301 are NAND cells that store data (data cells). It should be understood that DHC NAND string 300 could comprise more dummy cells above oxide separation region 310 and more data cells below region 310 than what is depicted in the Figures A silicon nitride cap layer 318 has also been formed in a well-known manner on oxide layer 316, and a high-aspect ratio channel trench 319 has been formed in a well-known manner. An oxide layer 320 and a polysilicon liner 321 (i.e., a pillar thin channel) have been formed in a well-known manner in channel trench 319. The range of thicknesses of liner 321 can range from about 30 Å to about 150 Å. In one exemplary embodiment, the nominal thickness of liner 321 is about 80 Å. In one exemplary embodiment, the level of doping of thin channel 321 is selected to optimize performance of the DHC in the pillar region. That is, the level of doping of pillar thin channel 321 is selected to provide an improved channel continuity and for maintaining a high string current. In one exemplary embodiment, phosphorous is used as the dopant. It should also be understood that other semiconductor materials could be used in place of polysilicon for thin channel 321. A spin on oxide (SOD) 322, i.e., an oxide fill, has been formed and densified in a well-known manner in trench 319.

Figure 3B:
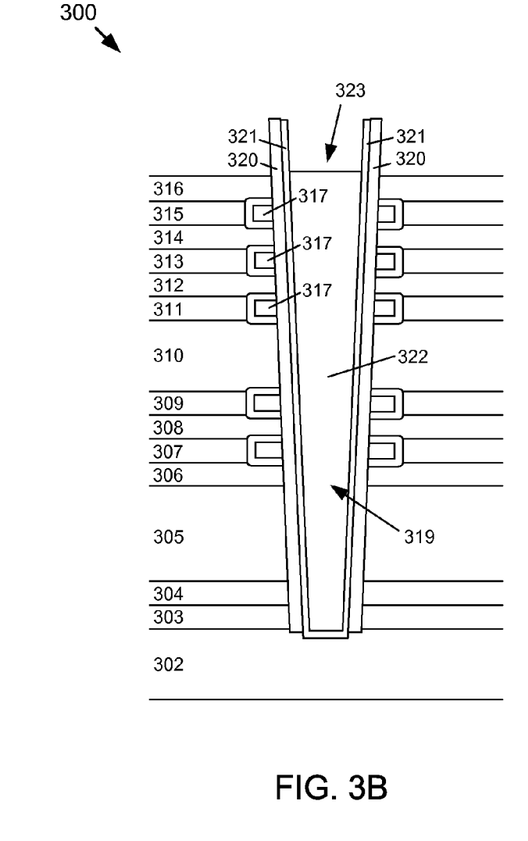

At 202 in FIG. 2, the nitride cap layer is removed in a well-known manner using a hot phosphorous wash. FIG. 3B depicts DHC NAND string device 301 after nitride cap layer 318 has been removed using a hot phosphorous wash. During the hot wash, oxide fill 322 is recessed at 323 below the tops of oxide layer 320 and polysilicon liner 321. The depth of the recess 323 of oxide fill 322 is controlled during the hot wash to align about with the top of oxide layer 316. The recess 323 formed in oxide fill 322 can be cleansed in a well-known manner using a Buffered Oxide Etch (BOE).

Figure 3C:
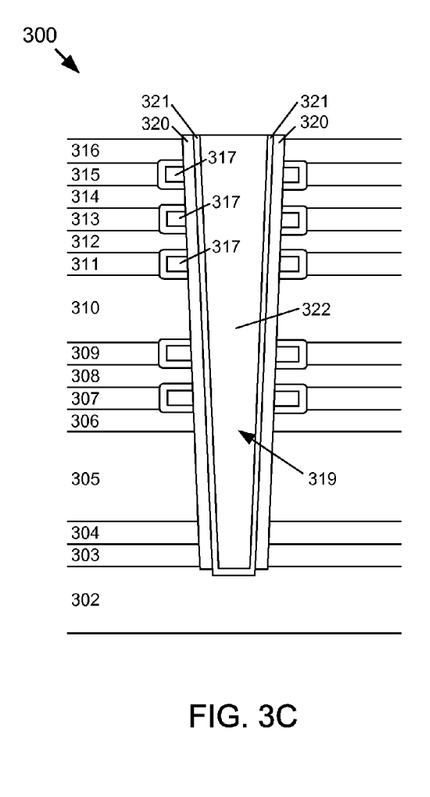

At 203 in FIG. 2, a buff chemical mechanical polishing (CMP) is performed in a well-known manner to planarize the top surface of the DHC NAND string device. FIG. 3C depicts DHC NAND string device 301 after a buff chemical mechanical polishing. During the buff CMP, the tops of oxide layer 320 and polysilicon liner 321 are removed.

Figure 3D:
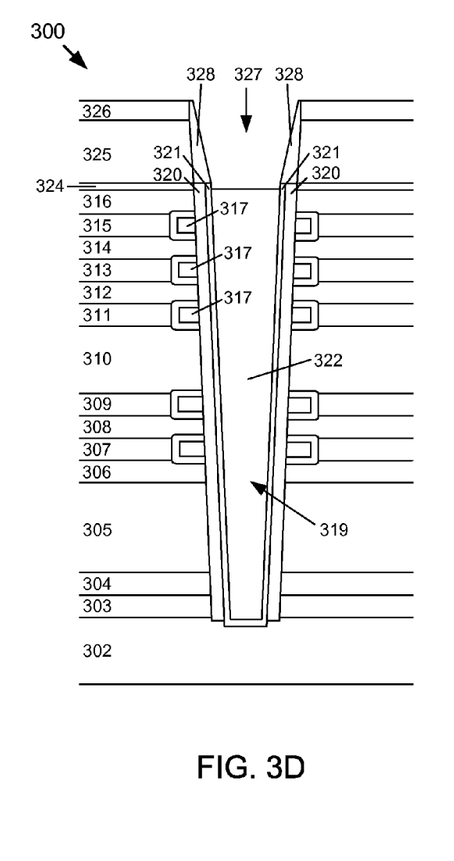

At 204 in FIG. 2, an oxide layer is deposited in a well-known manner on the top the top-tier oxide layer, and a layer of polysilicon is deposited in a well-known manner on the newly grown oxide to fort)) a Select Gate Drain (SGD). A layer of nitride is formed on the SGD layer. Afterward, a trench is formed in a well-known manner in the nitride layer and the polysilicon layer. An oxide is thermally grown in a well-known manner in the trench on the polysilicon layer and the nitride layer. FIG. 3D depicts DHC NAND string device 301 after operation 204 in FIG. 2 has been performed. In particular, a layer 324 of oxide has been deposited on oxide layer 316, and a layer 325 of polysilicon has been deposited on oxide layer 324. A layer 326 of nitride has been formed on polysilicon layer 325. A trench 327 has been formed in a well-known manner in nitride layer 326 and polysilicon layer 325. An oxide 328 has been thermally grown in a well-known manner in trench 327 on nitride layer 326 and polysilicon layer 325.

Figure 3E:
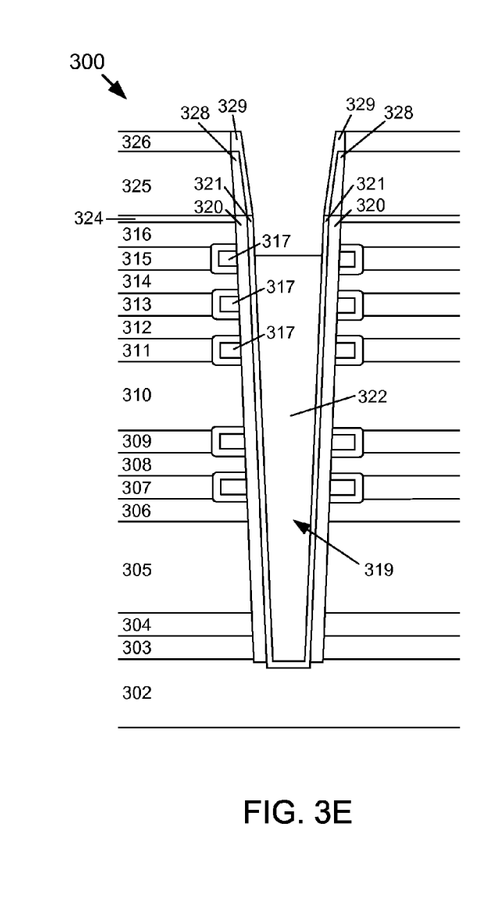

At 205 in FIG. 2, a layer of polysilicon is formed in a well-known manner on the oxide in the trench. A punch etch is performed in a well-known manner through the polysilicon and oxide to expose the oxide fill of the DHC NAND string device. FIG. 3E depicts DHC NAND string device 301 after a layer 329 of polysilicon has been formed on oxide 328. A punch etch through oxide 328 exposes oxide fill 322.

Figure 3F:
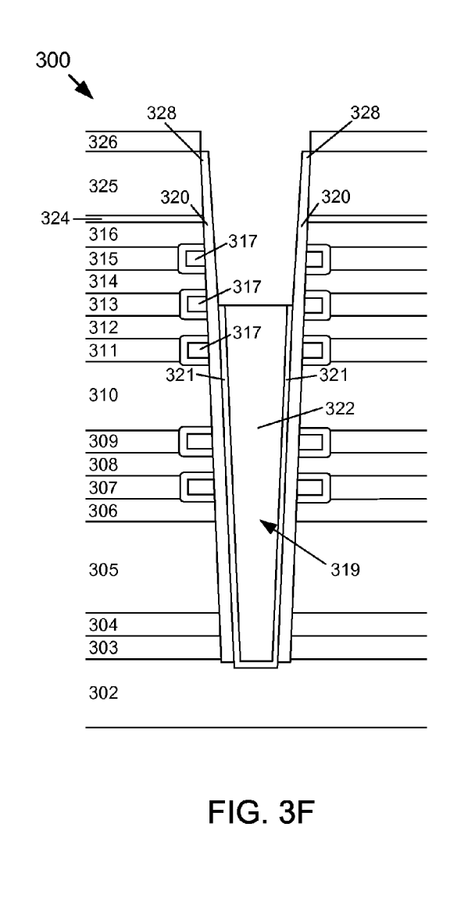

At 206 in FIG. 2, the polysilicon layer is removed in a well-known manner and the oxide fill is further recessed to expose the pillar thin channel of the DHC NAND string device. FIG. 3F depicts DHC NAND string device 301 after polysilicon layer 329 has been removed and oxide fill 322 has been further recessed to expose pillar thin channel 321.

Figure 4A:
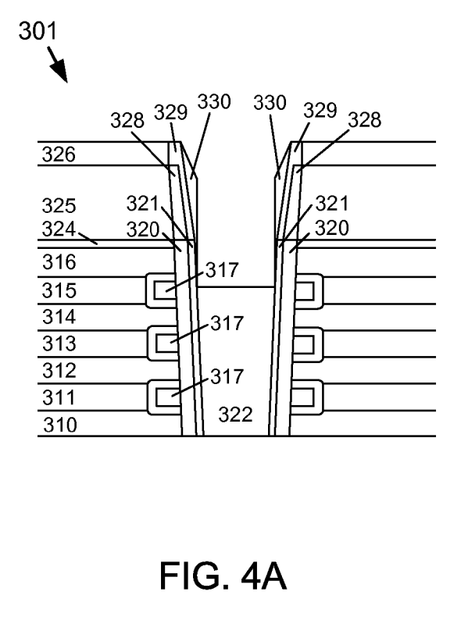
FIGS. 4A-4C depict in greater detail the process stages depicted in FIGS. 3E and 3F.
Figure 4B:
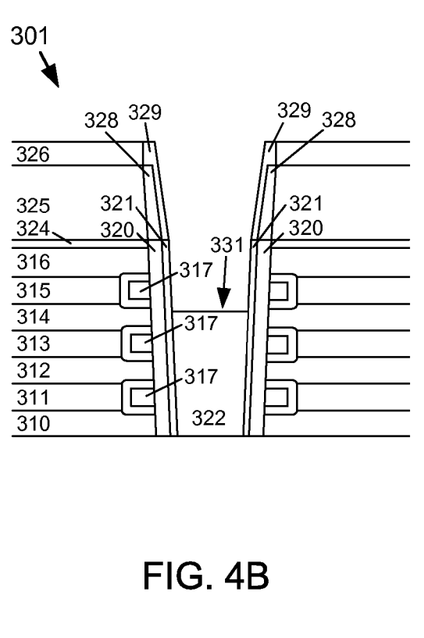
Figure 4C:
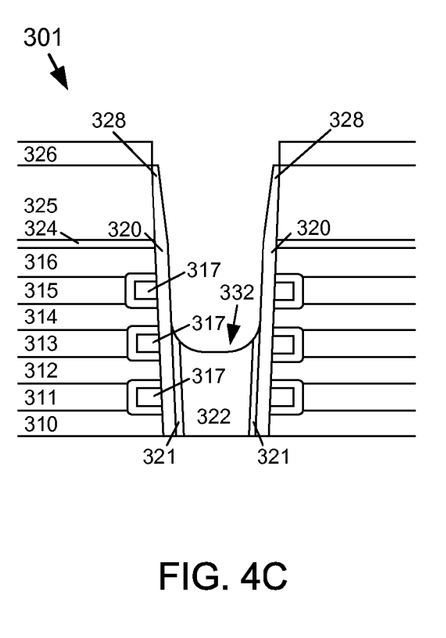

FIGS. 4A-4C depict in greater detail the process stages depicted in FIGS. 3E and 3F. FIG. 4A, which corresponds to FIG. 3E, depicts that after the punch etch through oxide 328, there is a native oxide growth 330 on polysilicon layer 329. In FIG. 4B, a selective oxide removal is performed in a well-known manner that removes native oxide 330 and further recesses oxide fill 322 at 331. In FIG. 4C, which corresponds to FIG. 3F, a selective removal of poly-silicon 329 is performed in a well-known manner using NH$_4$OH or TMAH that also removes some of pillar thin channel 321 and oxide fill 322 at 332, thereby exposing pillar thin channel 321 for subsequent processing.

Figure 3G:
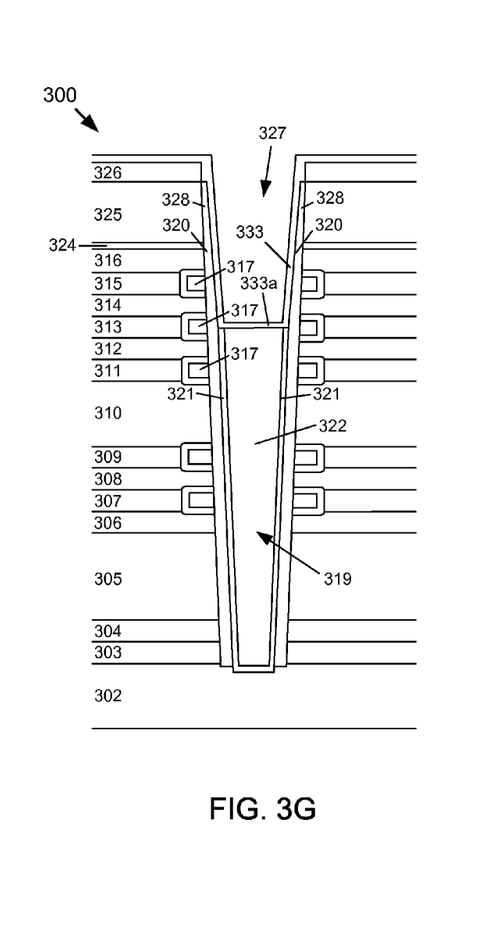

At 207 in FIG. 2, a thin channel of polysilicon (i.e., SGD thin channel) is deposited in a well-known manner onto the exposed oxide layer and the exposed pillar thin channel within the trench so that the SGD thin channel polysilicon contacts the pillar thin channel polysilicon. FIG. 3G depicts DHC NAND string device 301 after a layer of polysilicon for SGD thin channel 333 has been deposited onto the oxide layer 320/328 and the exposed pillar thin channel 321 in trench 327. The range of thicknesses of thin channel 333 can range from about 30 Å to about 150 Å. In one exemplary embodiment, the nominal thickness of thin channel 333 is about 80 Å.

During fabrication of SGD thin channel 333, the level of doping is selected to optimize performance of the DHC in the SGD region. That is, the level of doping of SGD thin channel 333 is selected to reduce leakage current that causes voltage boost (VBoost) degradation. In one exemplary embodiment, phosphorous is used as the dopant. It should also be understood that other semiconductor materials could be used in place of polysilicon for thin channel 333.

One exemplary embodiment provides that the interface between the pillar-doped thin channel 321 and the SGD-doped thin channel 333 is above bridge 333a in the overall pillar structure. For example, in exemplary embodiments in which SGD thin channel 333 is formed on a surface 332 like that depicted in FIG. 4C, bridge 333a would be below the interface between the pillar-doped thin channel 321 and the SGD-doped thin channel 333. In an alternative exemplary embodiment, the interface between the pillar-doped thin channel 321 and the SGD-doped thin channel 333 is at the same level as bridge 333a in the overall pillar structure. In yet another alternative exemplary embodiment, bridge 333a can be removed in a well-known manner by a selective wet clean, such as HF/NH$_4$OH or HF/TMAH for less than about two hours.

Figure 3H:
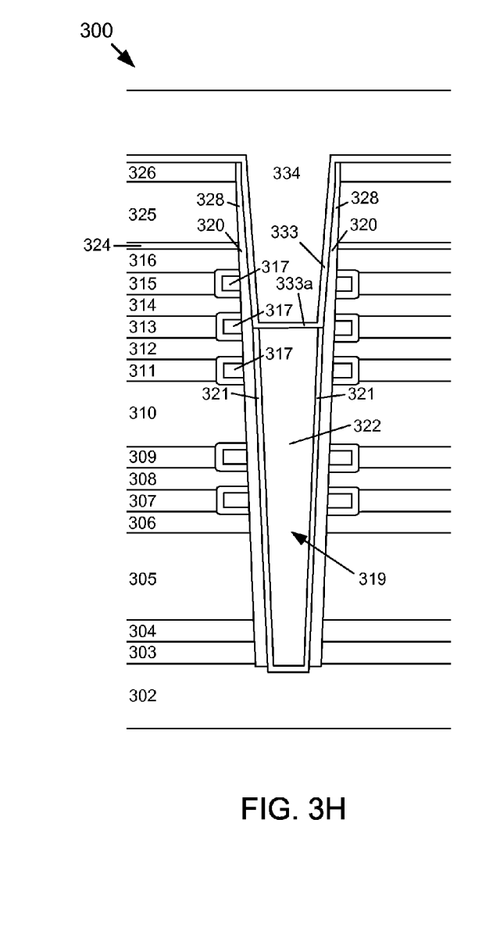

At 208 in FIG. 2, an additional oxide fill is formed in a well-known manner on the SGD thin channel, follow by a steam densification at about 400 C-500 C for about four hours. FIG. 3H depicts DHC NAND string 301 after additional oxide fill 334 has been formed on SGD thin channel 333, followed by steam densification of oxide fill 334.

Figure 3I:
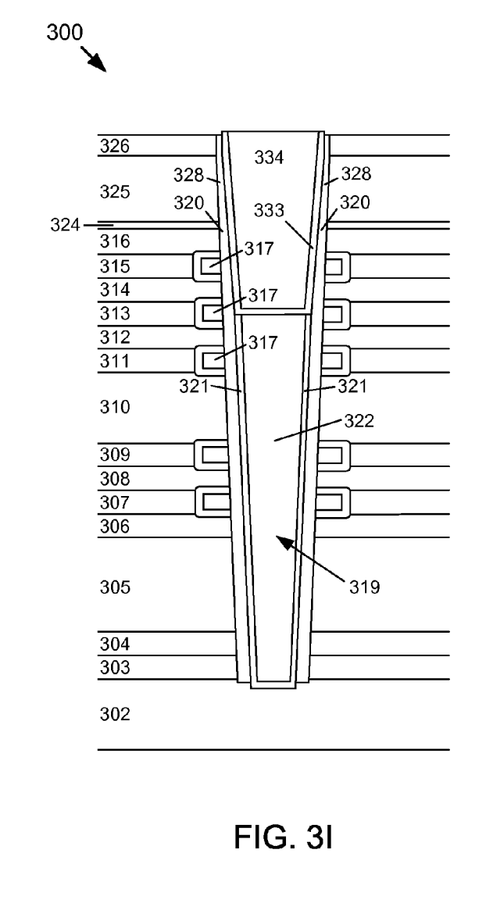

At 209 in FIG. 2, a CMP operation is performed in a well-known manner to planarize the top surface of DHC NAND string device 301 stopping at nitride layer 326. FIG. 3I depicts DHC NAND string device 301 after a CMP operation is performed to planarize the top surface of NAND string 301 stopping at nitride layer 326.

Figure 3J:
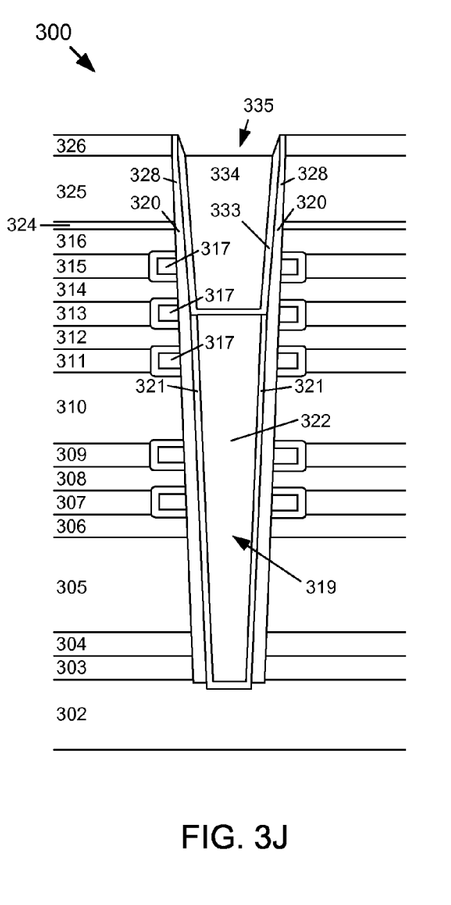

At 210 in FIG. 2, the oxide fill is recessed in a well-known manner using, for example, HF, MSE2 or a BOE chemistry, to prepare for depositing a polysilicon plug. FIG. 3J depicts DHC NAND string device 301 after oxide fill 334 has been recessed at 335.

Figure 3K:
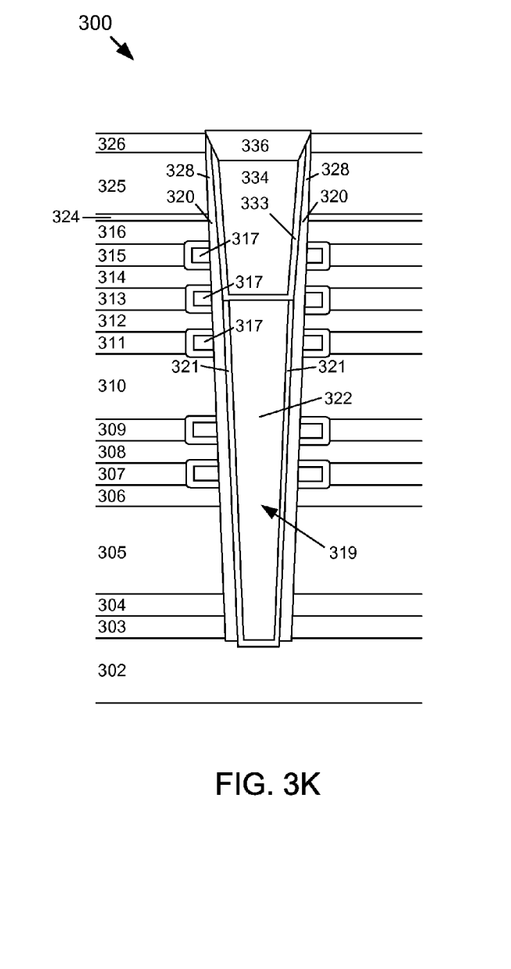

At 211 in FIG. 2, the recess is filled in a well-known manner with a polysilicon plug and then a CMP operation is performed in a well-known manner stopping at the nitride layer. FIG. 3K depicts DHC NAND string device 301 after recess 335 has been filled a polysilicon plug 336 and after a CMP operation has been performed stopping on nitride layer 326. Subsequently, polysilicon plug is coupled to a bit line (BL) (not shown).

It should be understood that although FIG. 2 depicts a flow diagram for an exemplary embodiment of a technique for forming a DHC vertical NAND string device in which two DHC pillar structures are formed one on top of the other, the subject matter disclosed herein is not so limited and the techniques disclosed herein could be used to form more than two DHC pillar structures on top of each other. Similar, the DHC vertical NAND string device depicted in FIGS. 1, 3A-3J and 4A-4C could be formed to have more than two DHC pillar structures on top of each other.

Figure 6:
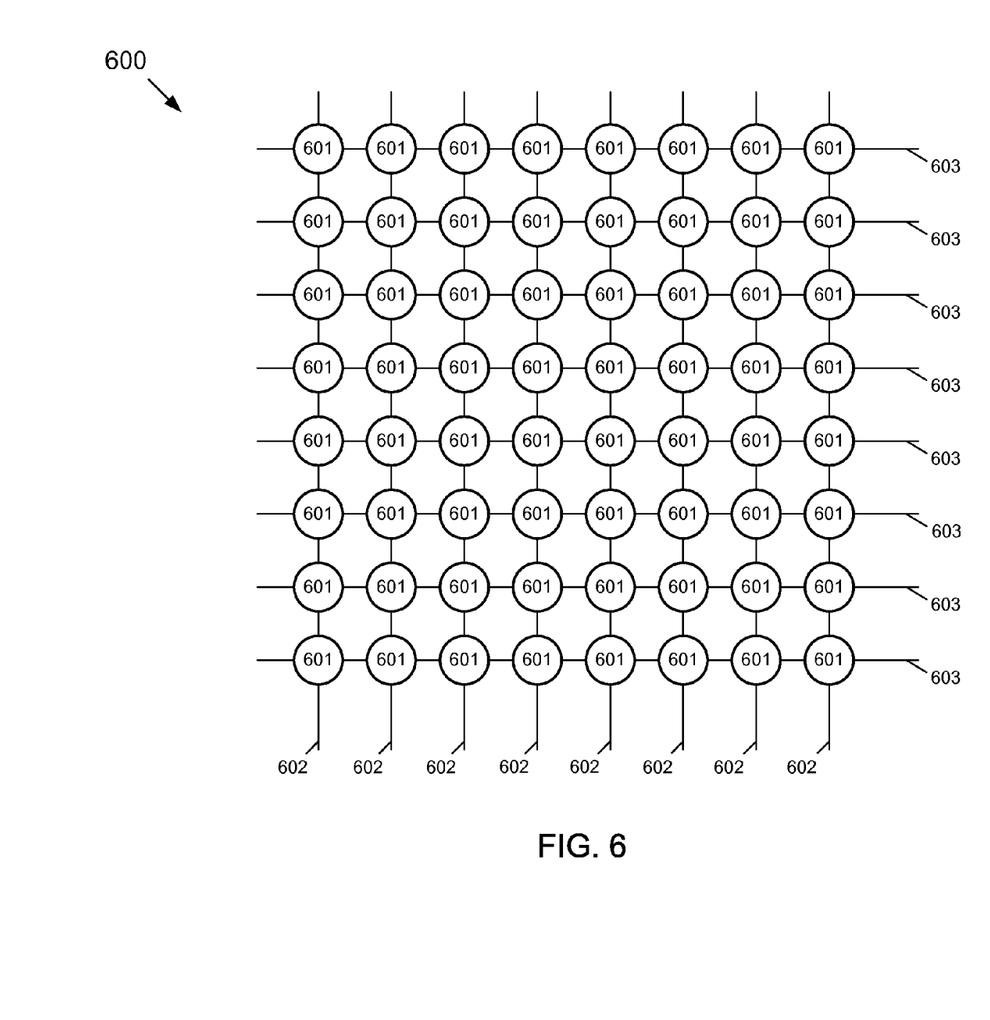
FIG. 6 depicts a schematic diagram of an exemplary embodiment of a memory array comprising one or more DHC NAND string devices according to the subject matter disclosed herein.

FIG. 6 depicts a schematic diagram of an exemplary embodiment of a memory array 600 comprising one or more DHC NAND string devices 601 according to the subject matter disclosed herein. In one exemplary embodiment, at least one memory cell 601 comprises a DHC vertical NAND string device comprising two three-dimensional (3D) thin channel regions formed on top of each other within the same pillar structure according to the subject matter disclosed herein. As depicted in FIG. 6, memory cells 601 are located at intersections of column signal lines 602 (e.g., bit lines) and row signal lines 603 (e.g., word lines). Individual column and/or row signal lines are electrically connected in a well-known manner to a memory controller (not shown) to selectively operate memory cells 601 in a well-known manner. It should be understood that memory array 600 can comprise part of a solid-state memory array or a solid-state drive that is coupled in a well-known manner to a computer system or an information-processing system (not shown).

Figure 7:
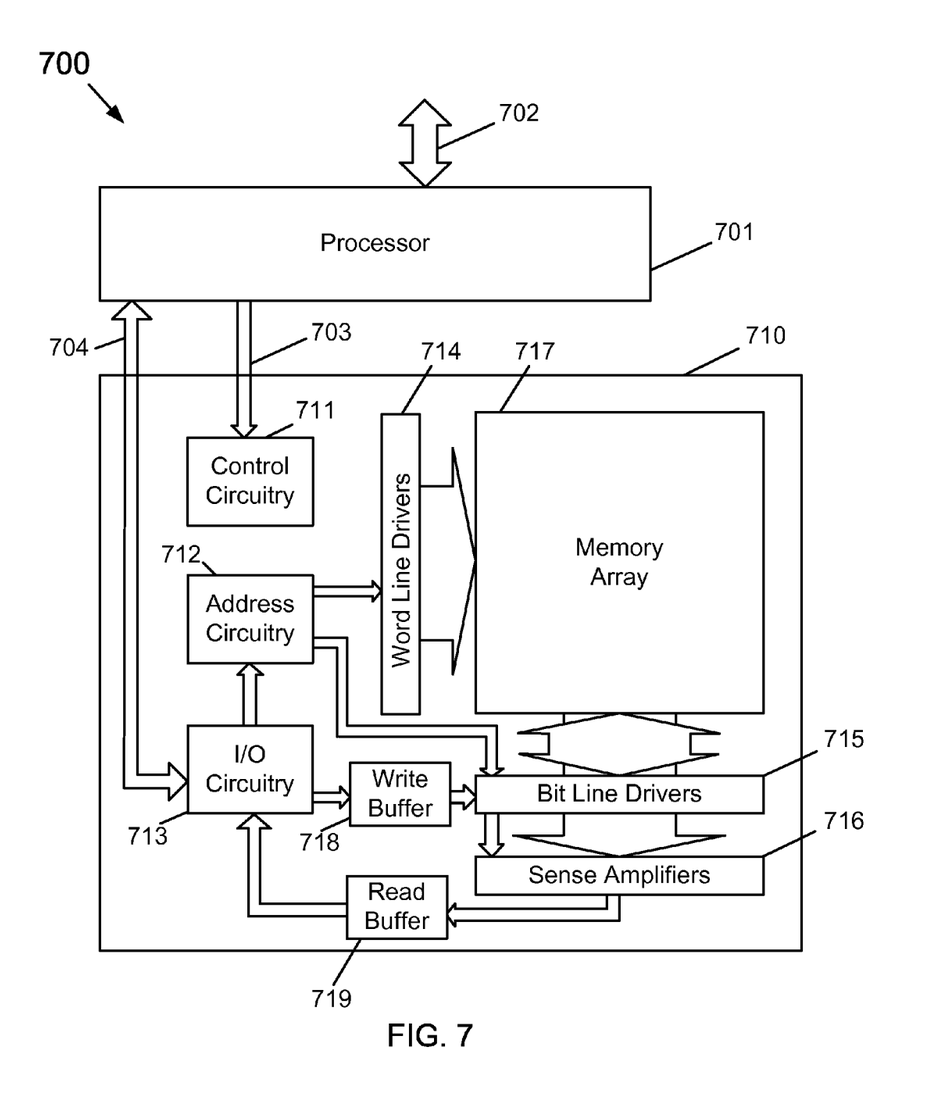
FIG. 7 depicts a functional block diagram of an exemplary embodiment of an electronic system comprising one or more DHC vertical NAND string devices comprising two three-dimensional (3D) thin channel regions formed on top of each other within the same pillar structure according to the subject matter disclosed herein.

FIG. 7 depicts a functional block diagram of an exemplary embodiment of an electronic system 700 comprising one or more DHC vertical NAND string devices comprising two three-dimensional (3D) thin channel regions formed on top of each other within the same pillar structure according to the subject matter disclosed herein. System 700 comprises a processor 701 that is coupled to a memory device 710 through control/address lines 703 and data lines 704. In some exemplary embodiments, data and control may utilize the same physical lines. In some exemplary embodiments, processor 701 may be an external microprocessor, microcontroller, or some other type of external controlling circuitry. In other exemplary embodiments, processor 701 may be integrated in the same package or even on the same die as memory device 710. In some exemplary embodiments, processor 701 may be integrated with the control circuitry 711, thereby allowing some of the same circuitry to be used for both functions. Processor 701 may have external memory, such as random access memory (RAM) (not shown) and/or read only memory (ROM) (not shown), that is used for program storage and intermediate data. Alternatively, processor 701 may have internal RAM or ROM. In some exemplary embodiments, processor 701 may use memory device 710 for program or data storage. A program running on processor 701 may implement many different functions including, but not limited to, an operating system, a file system, defective chunk remapping, and error management.

In some exemplary embodiments, an external connection 702 is provided that allows processor 701 to communicate to external devices (not shown). Additional I/O circuitry (not shown) may be used to couple external connection 702 to processor 701. If electronic system 700 is a storage system, external connection 702 may be used to provide an external device with non-volatile storage. In one exemplary embodiment, electronic system 700 may be, but is not limited to, a solid-state drive (SSD), a USB thumb drive, a secure digital card (SD Card), or any other type of storage system. External connection 702 may be used to connect to a computer or other intelligent device, such as a cell phone or digital camera, using a standard or proprietary communication protocol. Exemplary computer communication protocols that may be compatible with external connection 702 include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If electronic system 700 is a computing system, such as a mobile telephone, a tablet, a notebook computer, a set-top box, or some other type of computing system, external connection 702 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

Memory device 710 may include an array 717 of memory cells. Memory cell array 717 may be organized as a two dimensional or a three dimensional cross-point array and may include a phase-change memory (PCM), a phase-change memory with switch (PCMS), a resistive memory, nanowire memory, ferro-electric transistor random access memory (Fe-TRAM), a flash memory, magnetoresistive random access memory (MRAM) memory that incorporates memristor technology, a spin transfer torque (STT)-MRAM, or any other type of memory constructed as a cross-point array. In one exemplary embodiment, memory cell array 717 comprises one or more DHC vertical NAND string devices comprising at least two three-dimensional (3D) thin channel regions formed on top of each other within the same pillar structure according to the subject matter disclosed herein. Memory array 717 may be coupled to the word line drivers 714 and/or bit line drivers 715, and/or sense amplifiers 716 in a well-known manner. Address lines and control lines 703 may be received and decoded by control circuitry 711, I/O circuitry 713 and address circuitry 712, which may provide control to the memory array 717. I/O circuitry 713 may couple to data lines 704 thereby allowing data to be received from and sent to processor 701. Data read from memory array 717 may be temporarily stored in read buffers 719. Data to be written to memory array 717 may be temporarily stored in write buffers 718 before being transferred to the memory array 717.

It should be understood that electronic system 700 depicted in FIG. 7 has been simplified to facilitate a basic understanding of the features of the system. Many different embodiments are possible including using a single processor 701 to control a plurality of memory devices 710 to provide for more storage space. Additional functions, such as a video graphics controller driving a display, and other devices for human-oriented I/O may be included in some exemplary embodiments.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A memory device, comprising:
   a hollow-channel pillar structure comprising a first end and a second end, the first end of the pillar structure being coupled to a source and the second end of the pillar structure being coupled to a bit line,
   the pillar structure further comprising:
   a thin channel surrounding a dielectric material, the thin channel comprising a first region and a second region,
   the first region being located along the pillar structure in proximity to the source and the second region being located along the pillar structure distal from the source,
   the first region of the thin channel comprising a first level of doping and the second region of the thin channel comprising a second level of doping, and
   the second level of doping being different from the first level of doping.

2. The memory device according to claim 1, wherein the first level of doping improves a strong current in the thin channel, and the second level of doping reduces leakage current in the thin channel.

3. The memory device according to claim 1, wherein the thin channel comprises a polysilicon material.

4. The memory device according to claim 3, wherein the first level of doping improves a strong current in the polysilicon material, and the second level of doping reduces leakage current in the polysilicon materials.

5. The memory device according to claim 4, further comprising:
   a select gate source (SGS) formed at the first end of the pillar structure; and
   a select gate drain (SGD) formed at the second end of the pillar structure.

6. The memory device according to claim 5, further comprising at least one non-volatile memory cell formed along the pillar structure between the SGS and the SGD.

7. The memory device according to claim 1, wherein the memory device comprises part of a solid-state drive (SSD).

8. The memory device according to claim 1, wherein the memory device comprises part of an array of memory devices.

9. A memory device, comprising:
a source layer;
a first hollow-channel pillar structure formed on the source layer, the first hollow-channel pillar structure comprising a first thin channel having a first level of doping; and
a second hollow-channel pillar structure formed on the first hollow-channel pillar structure, the second hollow-channel pillar structure comprising a second thin channel having a second level of doping, the second thin channel being in contact with the first thin channel, and the second level of doping being different from the first level of doping.

10. The memory device according to claim 9, wherein the first level of doping improves a strong current in the first thin channel, and the second level of doping reduces leakage current in the second thin channel.

11. The memory device according to claim 9, wherein the first and second thin channels comprise a polysilicon material.

12. The memory device according to claim 11, wherein the first level of doping improves a strong current in the first thin channel, and the second level of doping reduces leakage current in the second thin channel.

13. The memory device according to claim 12, further comprising:
a select gate source (SGS) formed along the first pillar structure; and
a select gate drain (SGD) formed along the second pillar structure.

14. The memory device according to claim 13, further comprising at least one non-volatile memory cell formed along the first pillar structure, the second pillar structure, or a combination thereof, between the SGS and the SGD.

15. The memory device according to claim 9, wherein the memory device comprises part of a solid-state drive (SSD).

16. The memory device according to claim 9, wherein the memory device comprises part of an array of memory devices.

* * * * *